United States Patent [19]

Wada et al.

[11] Patent Number: 5,170,028
[45] Date of Patent: Dec. 8, 1992

[54] PROCESS AND APPARATUS, FOR ELECTRON BEAM WELDING OF A MEMBER PARTIALLY ENCLOSED IN VACUUM CHAMBER, AND THE MEMBER FORMED THEREBY

[75] Inventors: Takeshi Wada; Tatsuo Yonezawa; Noboru Umehara; Toshio Nemoto; Toshio Namatame, all of Hitachi, Japan

[73] Assignee: Hitachi, Ltd., Tokyo, Japan

[21] Appl. No.: 564,581

[22] Filed: Aug. 9, 1990

[30] Foreign Application Priority Data

Aug. 28, 1989 [JP] Japan ................ 1-221028

[51] Int. Cl.⁵ ........................................... B23K 15/00
[52] U.S. Cl. ..................... 219/121.13; 219/121.21; 219/121.22
[58] Field of Search ............... 219/121.14, 121.13, 219/121.21, 121.22, 121.31, 121.32

[56] References Cited

U.S. PATENT DOCUMENTS

| | | | |
|---|---|---|---|
| 3,535,489 | 10/1970 | Hinrichs | 219/121.22 X |
| 3,549,854 | 12/1970 | Sciaky | 219/121.22 X |
| 3,609,287 | 9/1971 | Hinrichs | 219/121.22 X |
| 4,080,526 | 3/1978 | Kihara et al. | 219/121.22 |
| 4,342,900 | 8/1982 | Susei et al. | 219/121.22 |

Primary Examiner—C. L. Albritton
Attorney, Agent, or Firm—Antonelli, Terry, Stout & Kraus

[57] ABSTRACT

An apparatus for welding of a member to be welded in a vacuum chamber accommodating a part of the member, comprises a housing for defining the vacuum chamber, the housing including upper and lower housings between which the member to be welded is held, the upper and lower housings each having front and rear sides; an electron gun mounted on the upper housing; a drive device for moving the electron gun in a welding direction; an adjustment member or adjustment liner plate disposed on the lower housing for defining spaces allowing a part of the member to be welded to fit in at the front and rear sides of the lower housing so that the entirety of a welding portion of the member is in the vacuum chamber and both sides of the welding line are exposed in vacuum; sealing material for sealing between the housing, the adjustment member or adjustment liner plate and the member to be welded.

20 Claims, 7 Drawing Sheets

PROCESS AND APPARATUS, FOR ELECTRON BEAM WELDING OF A MEMBER PARTIALLY ENCLOSED IN VACUUM CHAMBER, AND THE MEMBER FORMED THEREBY

BACKGROUND OF THE INVENTION

The present invention relates to a local vacuum type electron beam welding process and apparatus and, more particularly, to a local vacuum type electron beam welding process and apparatus suitable for a relatively long member of large size of electroconductive material that is to be produced by welding a plurality of pieces along a relatively short welding line in a direction traversing the length direction thereof, and to the member produced by the apparatus or method.

An example of the above-mentioned relatively long electroconductive member of large size is a poloidal field coil for a nuclear fusion reactor system. The poloidal field coil is disposed out of a vacuum chamber of a fusion reactor to generate a magnetic field for enclosing plasma in the vacuum chamber. The coil has an annular shape of which the diameter is 10 m, for example. The coil consists of a plurality of parts each having thickness of several ten mm and width of several hundred mm. The parts are arranged in an annular configuration and joined by welding the parts along the width direction, thereby forming the coil.

The coil has a large size, however and, welding lines between the parts are relatively short. The coil is produced by repeating the welding along the relatively short welding lines many times.

Hitherto, the coil was produced by using a high pulse TIG welding method. However, the welding method caused problems such that the strength in welded portions is lower than one of the parent material and the electric resistance in the welded portions increases by the welding.

It is known that the above-mentioned problems are solved by using an electron beam welding method. However, an electron beam welding apparatus having a large vacuum chamber which can contain such a large sized coil reaching to the diameter of 10 m is not available.

On the other hand, a local vacuum type electron beam welding apparatus is known which welds a member with electron beams by placing partially the member including a part to be welded into a vacuum chamber or by forming a vacuum portion around a part of the member. An example of prior arts of such a welding method or apparatus is disclosed in U.S. Pat. No. 4,080,526 filed Mar. 21, 1978.

An electron beam machining apparatus disclosed in the US patent comprises upper and lower fixed plates disposed on upper and lower sides of a member to be machined, respectively, to form upper and lower vacuum chambers, sealing members disposed between the member to be machined and the upper and lower plates around a machining or welding line, and a movable plate movably disposed on the upper fixed plate mounting thereon an electron gun and forming a movable vacuum chamber communicating with the upper vacuum chamber. The upper fixed member has a narrow groove extending the machining or welding line and a belt fitted in the groove. The belt is removed between forward and backward sides of the movable vacuum chamber to communicate the movable vacuum chamber with the upper vacuum chamber, and the belt is removed at the forward side of the movable vacuum chamber and fitted at the backward side to the groove as the movable plate moves. Thus, the belt is removed only at the movable vacuum chamber.

In the apparatus, a movement of the electron gun in a perpendicular direction to the machining or welding line is limited to within a width of the narrow groove, so that precise positioning between the machining or welding line and the upper plate is necessary.

Therefore, the apparatus is suitable for machining or welding of a member having a relatively long machining or welding line, but is not suitable to applying a member of large scale having a plurality of relatively short welding or machining line because the precise positioning is necessary many times.

Further, in order to seal the machining or welding or line ends, sealing members and pressing members pressing the sealing members are mounted at the end portions, so that it is difficult to weld the end portions to an extent that the weld is nearly the same as other portions.

Another example of the local vacuum type electron beam welding apparatus is disclosed in Japanese Patent Laid-Open No. 59-225891/1984 laid-opened Dec. 18, 1984. The apparatus comprises local vacuum chambers between which a member to be welded is sandwiched, and it is characterized by a sealing means between the local vacuum chambers. The sealing means comprises helium gas chambers disposed on both outsides of the vacuum chambers and containing therein helium gas of slightly higher pressure than the atmospheric pressure, and it is constructed so that the helium gas leaks into the interior of the vacuum chambers through gaps between the member to be welded and the local vacuum chambers. Thus, the electron beam welding is effected in an atmosphere favorable to welding.

SUMMARY OF THE INVENTION

An object of the present invention is to provide a local vacuum type electron beam welding apparatus which is simple in construction, easily applicable to members to be welded of various size and able to weld the entire weld line without causing any weld defects at weld end portions.

Another object of the present invention is to provide a local vacuum type electron beam welding apparatus which is suitable to weld a plurality of member pieces, each having a relatively short weld line traversing a length direction of a member formed by welding the pieces without causing any weld defects at weld end, and easily applicable to different size of the member pieces.

Another object of the present invention is to provide an electroconductive member which has a sufficient strength of weld portions and a sufficiently reduced electric resistance.

The present invention resides in an apparatus for welding of a member to be welded in a vacuum chamber accommodating a part of the member, comprising: housing means for defining the vacuum chamber, the housing means including upper and lower housings between which the member to be welded is held, the upper and lower housings each having front and rear sides; an electron gun mounted on the upper housing; drive means for moving the electron gun in a welding direction; adjustment means disposed on the lower housing for defining spaces allowing a part of the member to be welded to fit in at the front and rear sides of the lower housing so that the entirety of a welding portion of the member is in the vacuum chamber and both sides of the welding line are exposed in vacuum; sealing means for sealing between the housing means, the adjustment member and the member to be welded.

According to an aspect of the present invention, the adjustment means comprises a pair of adjustment members disposed in cut-out portions of the front and rear sides of the lower housing, respectively. Each of the adjustment members comprises a front side and a pair of projections projecting from the front side, and a guide groove formed in the front side between the projections for receiving the member to be welded. The adjustment member and the member to be welded are disposed on the lower housing so that their upper surfaces are level with an upper surface of the lower housing.

According to another aspect of the present invention, the adjustment means comprises a pair of adjustment liner plates each of which has a pair of extensions at one side thereof. The adjustment liner plates are disposed so that the extensions of one of the plates are opposite to the extensions of the other plate and the opposite extension ends define the spaces for allowing the member to be welded to fit in.

According to another aspect of the present invention, the sealing means including a rubber sheet having a width substantially equal to or slightly larger than upper surface width of the four sides of the lower housing and extending along the upper surface.

It is preferable to provide space for mounting tab members at both sides of the member to be welded so that no weld defects at weld starting and ending portions take place.

Most suitable members to be welded are electroconductive members, which are required not to be reduced in electric resistance and to have sufficient welding strength, in particular, poloidal field coils and toloidal field coils for a nuclear fusion reactor system.

According to the present invention, adjustment members or adjustment liner plates are put on the lower housing together with sealings to define spaces for the member to be welded, the member to be welded is put in the spaces on the lower housing together with sealings, a sealing member is put on the member to be welded, the adjustment member or adjustment line plate and the lower housing, the upper housing is put on the sealing member thereby forming the vacuum chamber in which a part of the member is accommodated, the vacuum chamber is evacuated, and then the member is welded by electron beams emitted by the electron gun being moved in the welding line.

For the adjustment member, it is preferable to prepare a plurality of adjustment members of which are different in size of the guide groove. By selecting the adjustment member of a suitable size and applying it to the lower housing, various members to be welded of various size can be easily accommodated partially in the vacuum chamber.

The adjustment liner plate can provide the space for allowing the member having various width size to fit in as long as the thickness is constant. When the members which are different in thickness are welded, the adjustment liner plate having the same thickness as the member to be welded is selected.

Thus, the welding operation is easily and promptly effected.

An electroconductive member such as poloidal field coil or toroidal field coil for a nuclear fusion reactor system which is produced by welding a plurality of pieces with the local vacuum type electron beam welding apparatus has a sufficient strength and a sufficiently reduced electric resistance even if it has many welding parts.

DESCRIPTION OF THE INVENTION

An embodiment of the present invention will be described hereunder in detail referring to FIGS. 1a to 11.

Figure 1A:
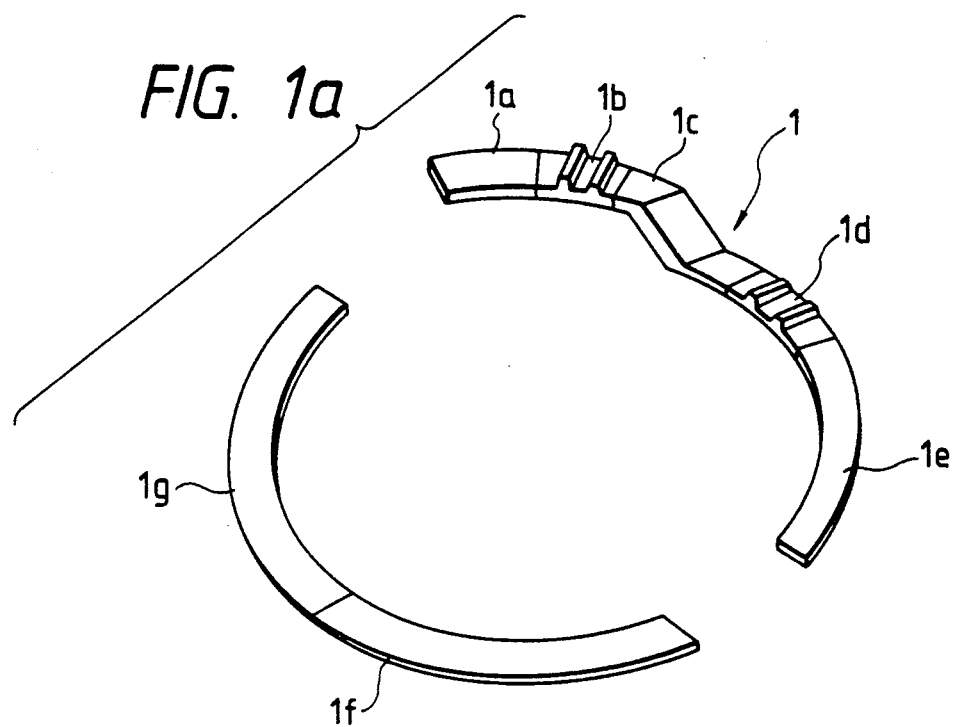
FIG. 1a is a perspective view of a part of a polodial field coil for a nuclear fusion reactor system.

FIG. 1a shows a poloidal field coil for nuclear fusion reactor system. The poloidal field coil is a typical example of a member to be welded by a local vacuum type electron beam welding apparatus which is an embodiment of the present invention.

The coil 1 comprises a plurality of copper pieces 1a, 1c, 1e, 1f and 1g, each of which is made of a rolled copper plate by bending it in a width direction thereof, and a plurality of copper pieces 1b and 1d, each of which is made of a rolled plate by machining it. Those copper pieces 1a to 1g are arranged in a ring shape and assembled in an annular coil by welding them. The welding is effected by the local vacuum type electron beam welding apparatus. An example of the size of the poloidal field coil 1 is such that the thickness, the width and the diameter are about 30 mm, 100 mm and 10 m, respectively, and the coil 1 comprises the copper pieces of about 700 which are welded into a ring.

Figure 1B:
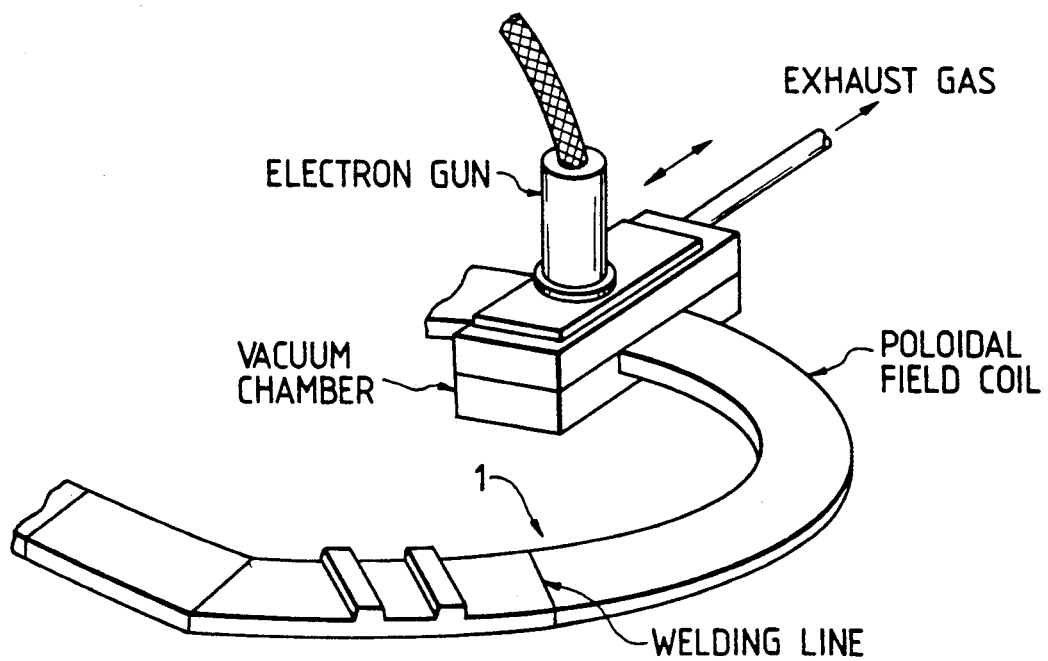
FIG. 1b is a schematic diagram of application of a local vacuum type electron beam welding apparatus according to the present invention to the poloidal field coil.

FIG. 1b shows that the local vacuum type electron beam welding apparatus (simply called EBM apparatus hereunder) is applied to the above-mentioned poloidal field coil 1.

Figure 2:
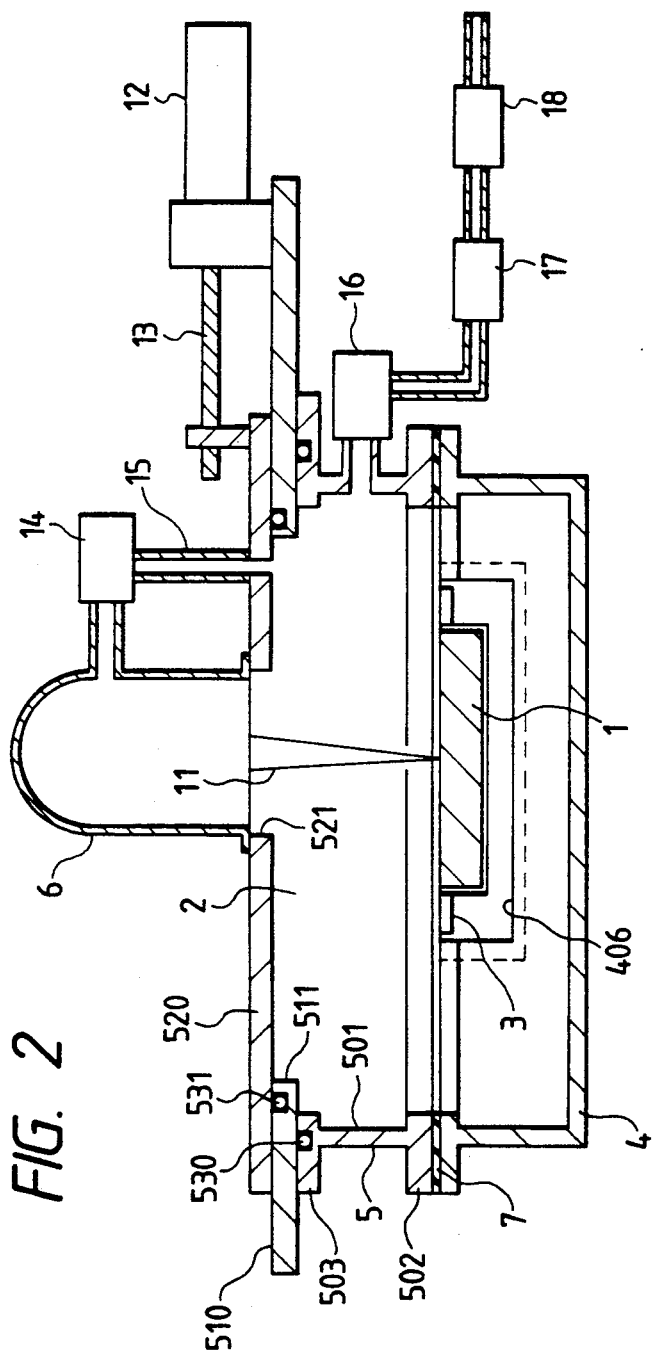
FIG. 2 is a sectional view of an embodiment of the local vacuum type electron beam welding apparatus according to the present invention.

In FIG. 2 showing substantially the entirety of the EBW apparatus, the EBW apparatus of local vacuum type comprises lower and upper housings 4, 5 defining a vacuum chamber 2, an electron gun 6, a vacuum pump 14 for evacuating the interior of the electron gun 6, and pumps 16, 17, 18 for evacuating the vacuum chamber 2.

A member 1 to be welded, for example, the poloidal field coil of copper material, is disposed in the vacuum chamber 2 at its welding portion with the other portion being supported by the lower and upper housings 4, 5.

Figure 3:
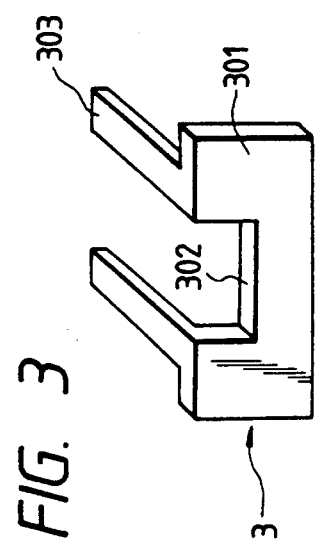
FIG. 3 is a perspective view of an adjustment member.
Figure 4:
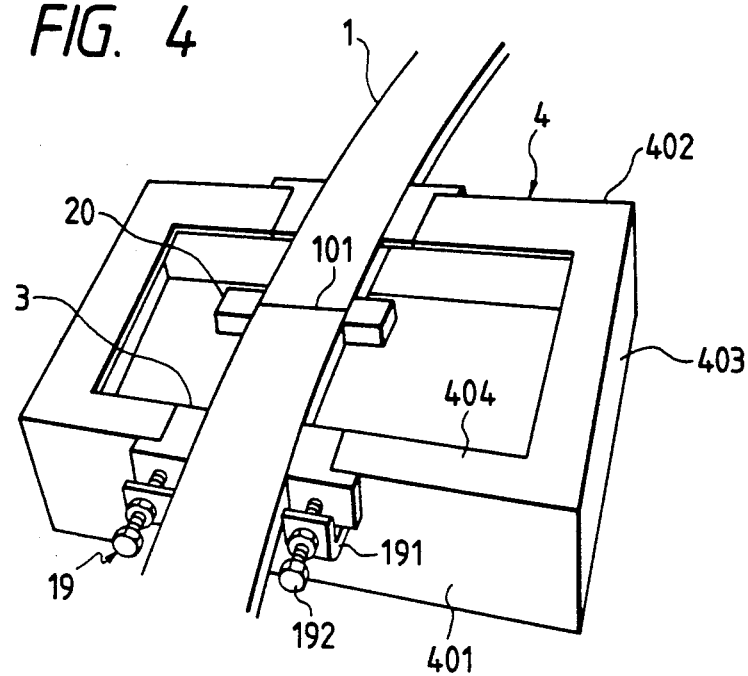
FIG. 4 is a perspective view of a lower housing to which the adjustment member and a member to be welded are attached.
Figure 5:
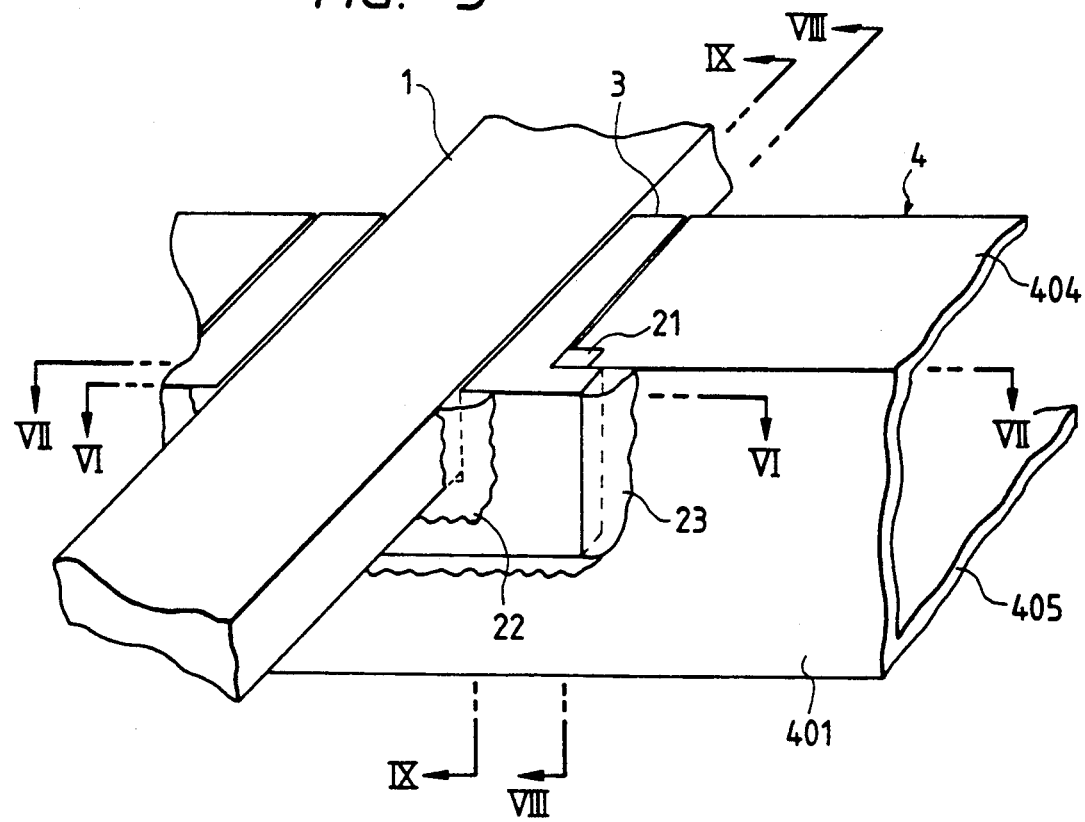
FIG. 5 is an enlarged view of a part of FIG. 4.
Figure 11:
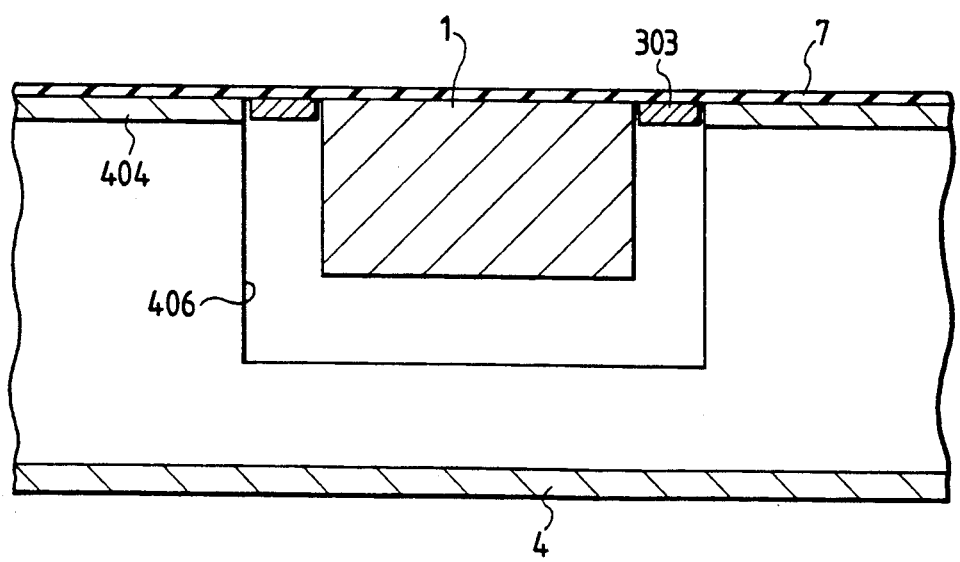
FIG. 11 is a sectional view taken along a line XI—XI of FIG. 10.

The lower housing 4 has four sides 401, 402, 403, an upper side 404, and a bottom 405, as shown in FIGS. 4 and 5. Front and rear sides 401, 402, of the four sides, each have a cut-out portion 406, as shown in FIG. 11. The cut-out portion 406 is for receiving a member to be welded or the coil 1 through an adjustment member, therefore, the dimension of the cut-out portion 406 is larger than the section of the member 1. As shown in FIG. 3, the adjustment member 3 has a front portion 301 with a guide groove or portion 302 and a pair of projection portions 303 projecting perpendicularly from the front portion 301. Each projection portion 303 has the same length as the width of upper peripheral portion of the front or rear side of the lower housing as shown best in FIG. 5. The upper surface of the front and projection portions 301, 303 is flat and level with each.

The member 1 to be welded is fitted in the guide portion 302 of the adjustment member 3 which is disposed in the cut-out portion 406 of the lower housing 4 and fixed thereto by a clamp 19 so that the upper surfaces of the adjustment member 3 and the upper side 404 of the lower housing 4 have substantially the same level. The upper surfaces of the fitted member 1 and the adjustment member 3 are of the same level. Thus, the member 1 to be welded, the adjustment member 3 and the upper side 404 of the lower housing 4 have the upper surfaces of substantially the same level.

The clamps 19 comprise brackets 191 secured to the front and rear sides 401, 402 of the lower housing 4 and bolts 192. The brackets 191 each have a nut engaging with the bolt 192, whereby the adjustment member 3 is pressed on and fixed to the housing 4 by driving the bolts 192.

Figure 7:
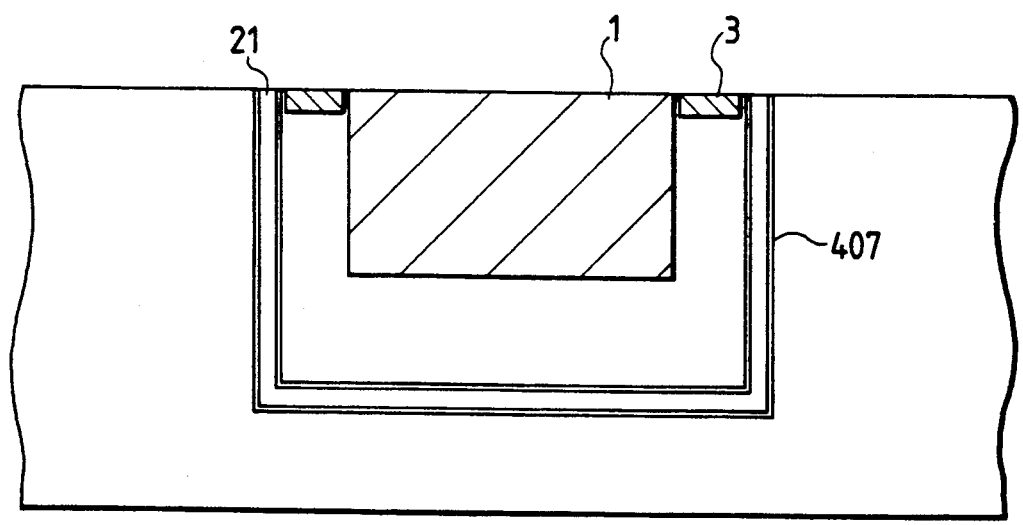
FIG. 7 is a sectional view taken along a line VII—VII of FIG. 5.
Figure 8:
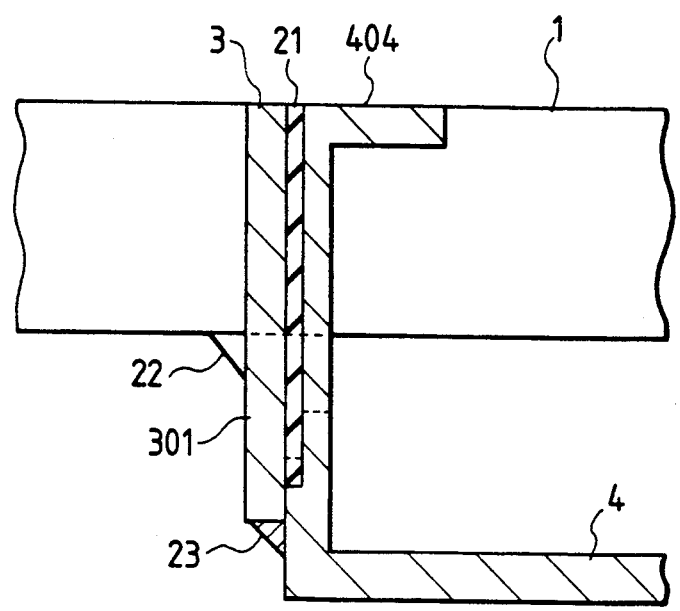
FIG. 8 is a sectional view taken along a line VIII—VII of FIG. 5.
Figure 9:
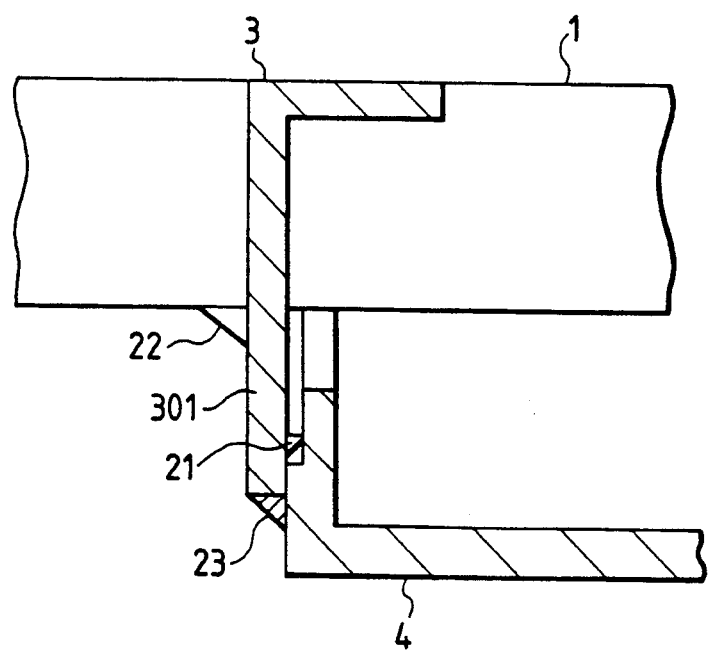
FIG. 9 is a sectional view taken along a line IX—IX of FIG. 5.

A sealing member 21 such as rubber plate is disposed between the front side 401 of the lower housing 4 and the front portion 301 of the adjustment plate 3 to secure air tightness therebetween as shown in FIGS. 8 and 9. The sealing member 21 has a rectangular shape whose one side is opened as shown in FIG. 7, and disposed in a groove 407 formed in the front side 404 of the lower housing 4. Another sealing member 21 is provided on the rear side in a same fashion.

Figure 6:
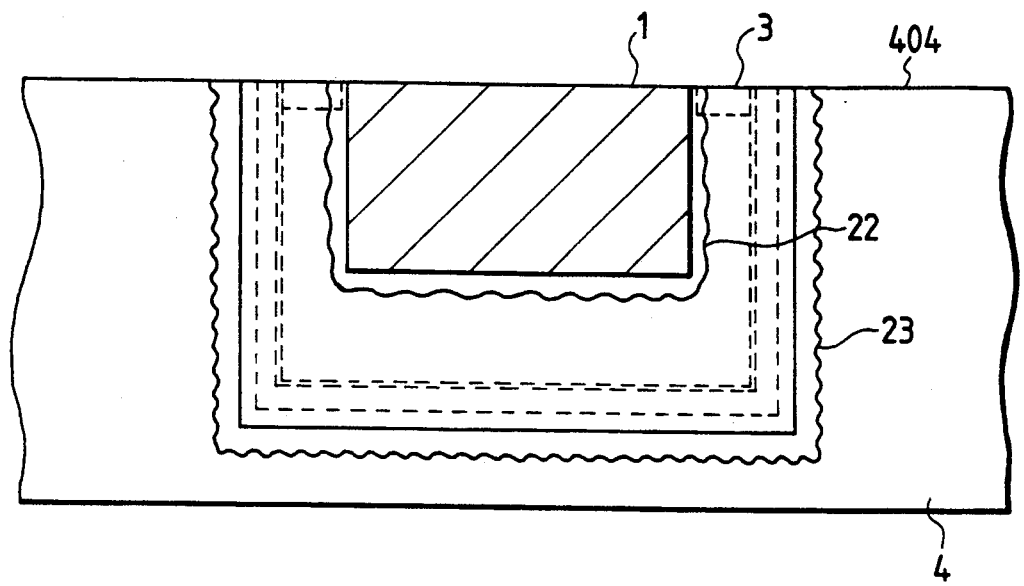
FIG. 6 is a sectional view taken along a line VI—VI of FIG. 5.

Between the member 1 to be welded 1 and the adjustment member 3, a rubber clay 22 as adhesive sealing material is applied to secure air seal therebetween. The rubber clay 22 is adhered as shown in FIG. 6. As shown in FIG. 6, between the adjustment member 3 and the lower housing 4, a sealing member 23 of rubber clay is adhered along the periphery of the front portion 301 of the adjustment member 3 except for the upper portion.

Figure 10:
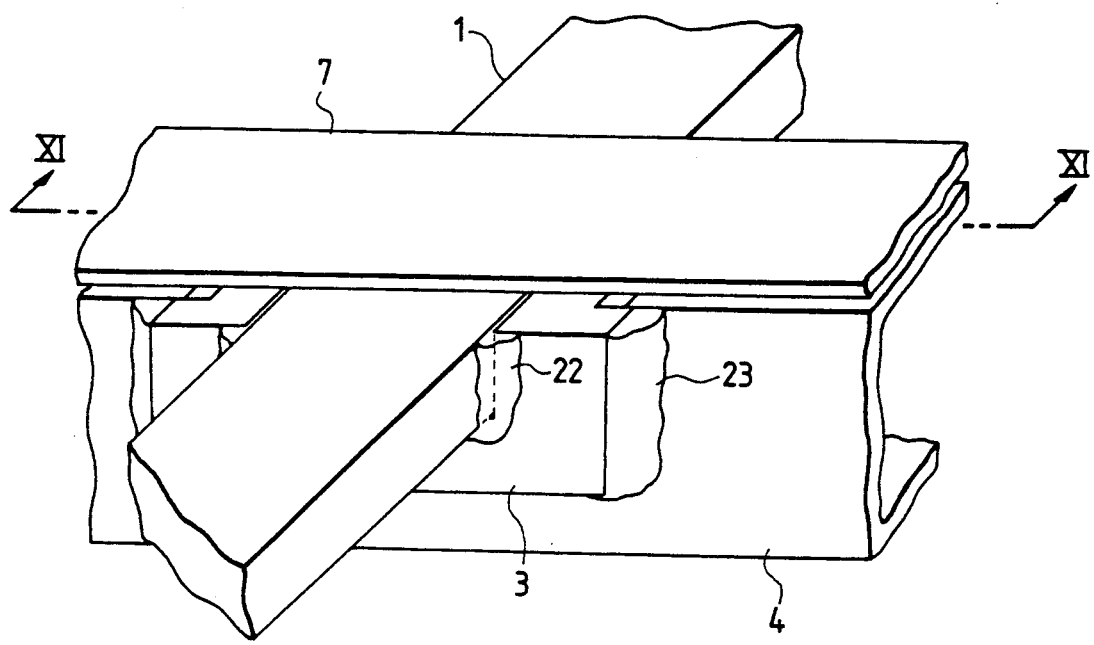
FIG. 10 is a perspective view of a part of the local vacuum type electron beam welding apparatus shown in FIG. 2.

A sealing member 7 of rubber sheet is put on the upper side 404 of the lower housing 4 as shown in FIGS. 10 and 11. The rubber sealing member 7 has a rectangular shape similar to the upper side 404 of the lower housing 4. The sealing member 7 has a thickness, which is larger than gaps between the member 1 to be welded, the adjustment member 3 and the housing 4, and a sufficient width, taking into consideration the above-mentioned gaps and the toughness of the sealing member 7 so as to prevent its deformation slipping into the gaps due to vacuum force when the vacuum chamber 2 is evacuated.

An example of the size of the sealing member 7 is such that the thickness is about 5 mm, and the width 30 mm or more. The size of the sealing member 1 is preferable to be slightly beyond the outer periphery of the lower housing 1. For example, it is preferable that all the upper surfaces of the adjustment plate and the upper side 404 of the lower housing 4 are covered with the sealing member 7.

Such sealing member 7 brings a sufficient sealing effect even if there is 0.5 mm or less difference in height between the upper surfaces of the lower housing 4, the upper surface of the adjustment member 3, and the member 1 to be welded.

Under the condition as shown in FIG. 11, the upper housing 5 is put on the lower housing 4.

The upper housing 5 has a four side wall 501, a lower and upper sides 502, 503, a first cover member 510 having a central opening 511 and slidably put on the upper side, and a second cover member 520 having a relatively small opening 521 and slidably put on the first cover member 520 to cover the opening 511 of the first cover member 510. Between the upper housing 5, the first cover member 510 and the second cover member 520, sealing members 530, 531 are disposed to secure air tightness.

The electron gun 6 is fixed to the second cover member 520 so that the electron beams 11 will be emitted to the member 1 to be welded. The interior of the electron gun 6 is communicated with the vacuum chamber 2 by a pipe 15 connected to the electron gun 6 and the second cover member 520 and provided with the vacuum pump 14. The pump 14 sucks air from the interior of the electron gun 6 and exhausts air into the vacuum chamber 2. This vacuum pump system is effective to secure high vacuum.

The upper housing 5 is provided with a series of the vacuum pumps 16, 17 and 18, whereby the vacuum chamber 2 is evacuated.

The electron gun 6 is moved together with the second cover member 520 to travel along a direction such as welding line by the drive device 12 secured to the first cover member 510, and a screw 13 engaged with a screw member secured to the second cover member 520.

The drive device 12 rotates the screw 13. The rotation of the screw 13 moves the second cover member 520. The first cover member 510 also can be moved in a perpendicular direction to the welding line by a similar drive device (not shown) if necessary. Thus, the electron gun 6 can be moved over a wide range so as to direct the electron beam emission on the welding line 101, so that even if the weld line 101 has any distance from the front or rear side of the lower housing 4, the electron gun 6 can be easily moved to a desired position.

The adjustment member 3 is for adjusting fitness between the guide groove 406 of the lower housing 4 and the member 1 to be welded. By preparing various kinds of adjustment members 3 each having different size, the EBW apparatus according to the present invention can be applied to welding of various members to be welded having different sectional scales, without changing the scale of the apparatus or modifying the lower and upper housings 4, 5.

The vacuum pump 14 evacuates the interior of the electron gun by exhausting gas into the vacuum chamber 2, so that the electron gun 6 can obtain a higher vacuum than in the vacuum chamber 2.

The vacuum pumps 16, 17, 18 are arranged in a fashion of cascade so that a desired vacuum in the vacuum chamber 2 can be obtained easily.

The desired vacuum is $1 \times 10^{-3}$Torr in the electron gun 6, and $1 \times 10^{-2}$Torr in the vacuum chamber 2, those vacuum are necessary for the EBW apparatus of local vacuum type.

In an operation of the EBW apparatus of local vacuum type, under the condition that the upper housing 5 is removed from the lower housing 4, an adjustment member 3 suitable for a member 1 to be welded is selected.

The selected adjustment member 3 is disposed in the guide groove of the lower housing 4 so that the sealing member 21 is pressed between the adjustment member 3 and the lower housing 4, and then clamped by the clamp 19. In this step, the upper surfaces of the adjustment member 3 and the housing upper side 404 have the same level, that is to say, the level difference is within 0.5 mm.

Two of the members 1 to be welded are fitted in the guide portion 303 of the adjustment member 3 so that the weld portions abut against each other as shown in FIG. 4, thereby forming a weld line 101. Both sides of the weld line 101 are disposed within the vacuum chamber 2 and have sufficient distances from both the sides 403, respectively. It is preferable to provide tab member 20 on the both sides of the member 1 at the weld line. The tab member 20 is made of the same material as the member 1 to be weld. Weld defects are likely to take place at the ends of the weld line 101 when the ends are exposed in vacuum without such a tab member. By providing the member 1 to be welded with the tab members 20 at both sides, weld starting and weld end portions are in the tab members 20, which means that the electron beam welding at the both ends can be effected under the same welding conditions as one within the width of the member 1 to be welded. Thus, the complete welding is effected along the entire weld line 101. The tab members 20 are removed after welding.

After finishing mounting of the member 1 on the lower housing 4 and the tab member on the member 1, the sealing members of rubber clay 22, 23 are adhered as shown in FIG. 6.

The sealing member 7 of rubber sheet also is disposed on the upper side 404 of the lower housing 4 as shown in FIGS. 10 and 11.

The upper housing 5 is disposed on the sealing member 7 so that the sealing member 7 is sandwiched by the upper side of the lower housing 4 and the lower side of the upper housing 5. When the first and second cover members 510, 520 are in a state as removed from the side wall member 501, they are put on the side wall member 501 with the sealing members 530, 531 so as to form the vacuum chamber 2. After the vacuum chamber 2 is completed, it is evacuated by the vacuum pumps 16, 17, 18, and then the vacuum pump 14 is operated, whereby the desired vacuum as mentioned above is established in the vacuum chamber 2 and the interior of the gun 6.

The electron gun is moved so as to move along the welding line 101 from one of the tab members to the other tab member while emitting electron beams to the welding line.

After finishing the welding, the upper housing 5 and the sealing member 7 are removed from the lower housing 4, and then the welded member 1 is removed.

At the time of the welding, heat is generated and the member to be welded is heated, so that the sealing member such as rubber clay may deform to detract from the vacuum. Therefore, a rapid welding operation is preferable.

Figure 12:
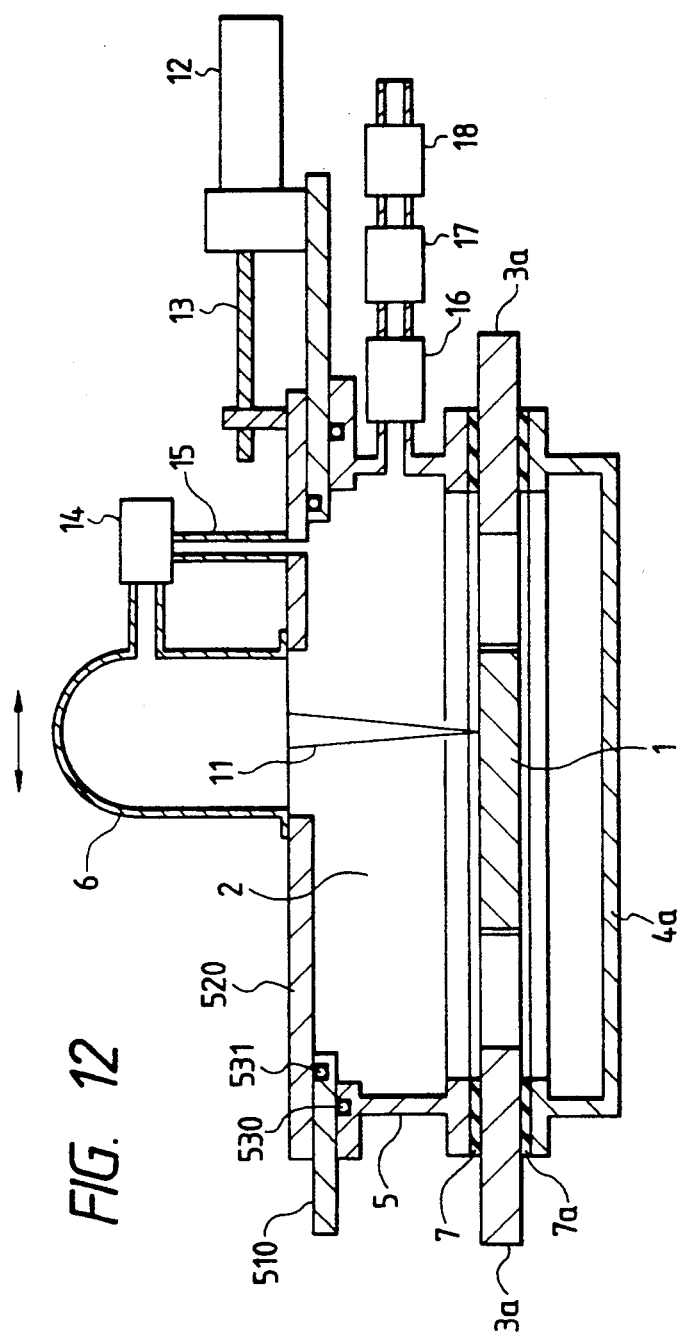
FIG. 12 is a sectional view of a local vacuum type electron beam welding apparatus of another embodiment of the present invention.
Figure 13:
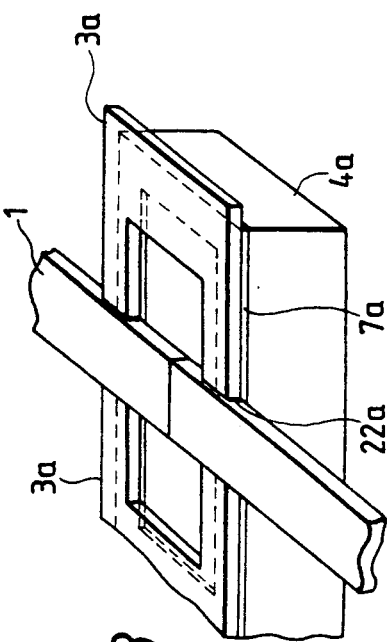
FIG. 13 is a perspective view of a part of the local vacuum type electron beam welding apparatus of FIG. 12.

Another embodiment of the present invention will be described referring to FIGS. 12 and 13.

An EBW apparatus of local vacuum type according to this embodiment has the same structure concerning the upper housing 5, the electron gun 6, the vacuum pumps 14, 16, 17, 18, and the drive device 12, 13. Therefore, the explanation thereof is omitted.

A lower housing 4a has no guide grooves or cut-out portions as formed by cutting out the front and back sides of the lower housing 4a. Except for this point, the lower housing 4a is the same as the lower housing 4 of the previous embodiment.

The lower housing 4a has a upper flat surface over the entire periphery.

On the flat upper surface of the lower housing 4a, a sealing member 7a which is the same as the sealing member 7 is put on. On the sealing member 7a, a pair of adjustment members which are liner plates 3a, are put. The adjustment liner plates 3a, each have a rectangular shape whose one side, is opened. That is, it has a pair of extension 31a at one side and the thickness is substantially constant over the entirety.

The liner plates 3a are put on the lower housing 4a through the sealing member 7a with a gap or space therebetween which is substantially the same as or slightly larger than the width of the member 1 to be welded. The member 1 is inserted in the gap under this condition, and rubber clay 22a is adhered to corners formed by the member 1 and the adjustment liner plate 3a at the outside. The sealing member 7 and the upper housing 5 are put on the liner plates 3a and the member 1 to be welded. Thus, the vacuum chamber 2 is completed. Then, the evacuation and then electron irradiation are effected in a similar manner to the previously mentioned embodiment.

The adjustment liner plates 3a has the same thickness as that of the member 1 to be welded.

When members having the same thickness as that of the adjustment liner plates 3a are welded, even if the members have different width, the same adjustment liner plates 3a can be used, that is, the adjustment liner plates 3a can be applied by adjusting the gap through adjustment of the positions of the adjustment liner plates 3a.

When members of different thickness are welded, the adjustment liner plates 3a having the same thickness as the members are selected for use.

According to this embodiment, the operation for sealing the vacuum chamber 2 is easier than the previously mentioned embodiment because a part of an operation of adhesion of the rubber clay 22, 23 can be omitted.

In any embodiments of the present invention, sealing members are not inserted between the member to be welded and the adjustment member 3 or the adjustment liner plate 3a except for at the outside, so that it is easy to fit the member to be welded in the space or gap defined by the adjustment member 3 or the adjustment liner plate 3a, and to provide pad members at the end portions of the weld line to weld a weld line end portion in the same conditions as between the weld line end portions.

What is claimed is:

1. An apparatus for electron beam welding of a member to be welded in a vacuum chamber, with a part of the member located in said vacuum chamber, said apparatus comprising:

housing means for defining said vacuum chamber, said housing means having an upper and lower housing;

an electron gun mounted on said upper housing;

drive means for moving said electron gun in a working direction;

detachable adjustment means for defining, between said upper and lower housing, plural spaces, each of said plural spaces allowing a part of the member to be welded to be mounted so that a welding line portion of the member is disposed in said vacuum chamber with both sides of said welding line portion being spaced from said upper and lower housings;

sealing means for sealing between said housing means, said adjustment means and the member to be welded; and means for evacuating said vacuum chamber.

2. The apparatus according to claim 1, wherein said lower housing includes plural cut-out portions, formed in front and rear sides thereof and each of said plural cut-out portions receiving said detachable adjustment means, said detachable adjustment means comprising a pair of adjustment members, fitted in said plural cut-out portions of said front and rear sides of said lower housing, respectively and each of said pair of adjustment members having a guide groove for receiving the member to be welded.

3. The apparatus according to claim 1, wherein said detachable adjustment means comprises a pair of adjustment liner plates, disposed on an upper surface of said lower housing to form said plural spaces therebetween at front and rear sides of said lower housing for allowing the member to be welded to be mounted.

4. An apparatus for electron beam welding of a member to be welded in a vacuum chamber enclosing therein a part of the member, comprising:

upper and lower housing defining the vacuum chamber for surrounding a periphery of the member to be welded and holding the member to be welded therebetween;

each of a pair of adjustment members having a front portion, each of a pair of projections substantially perpendicularly projecting from an upper portion of said front portion, and a guide portion formed between said pair of projections for mounting therein the member to be welded, said pair of said adjustment members being mounted in plural cut-out portions formed in front and rear sides of said lower housing, respectively, so that upper surfaces of the projections are level with an upper edge of said front and rear sides of said lower housing;

each of seal members disposed between said front portion of said adjustment members and said front and rear sides of said lower housing and compressed by said front portion of the adjustment members on said front and rear sides of said lower housing thereby creating a seal between said lower housing and said adjustment members;

adhesive sealing material provided between said front portion of each of said adjustment members and the member to be welded;

a sealing sheet disposed between said upper and lower housing;

an electron gun slidably provided on said upper housing;

a drive device for moving said electron gun in a welding direction; and vacuum pumps provided to evacuate the vacuum chamber.

5. The apparatus according to claim 4, wherein said sealing sheet includes a substantially rectangular shape with a substantially rectangular opening at the center so as to cover a surface of an abutment of said upper and lower housings.

6. The apparatus according to claim 4, wherein said upper housing comprises a side wall portion, a first cover member slidably and sealingly disposed on said side wall portion and having a central opening and a second cover member having a central opening smaller than said central opening of said first cover member and slidably and sealingly disposed on said first cover member so as to cover said central opening of said first cover member, said electron gun being mounted on said second cover member to emit electron beams in said vacuum housing through said central openings of said first and second cover members.

7. The apparatus according to claim 4, wherein a pipe having a vacuum pump is provided to communicate an interior of said electron gun with said vacuum chamber whereby said vacuum pump evacuates the interior of said electron gun and exhausts an exhaust gas into said vacuum chamber.

8. The apparatus according to claim 6, wherein said drive device is mounted on said first cover member and connected to said second cover member to move said second cover member thereby to move said electron gun.

9. An apparatus for an electron beam welding of a member to be welded in a vacuum chamber enclosing therein a part of the member, said apparatus comprising:

upper and lower housing defining the vacuum chamber and holding the member to be welded between said upper and lower housing;

each of a pair of adjustment liner plates having a flat plane and a pair of extensions extending from one side of said each of said pair of adjustment liner plates and defining a space therebetween, said pair of adjustment liner plates being disposed on said lower housing so that an extension of a first adjustment liner plate of said adjustment liner plates is opposite to an extension of a second adjustment liner plate of said adjustment liner plates with a gap therebetween for allowing the member to be welded to be mounted, a weld line being disposed between said pair of extensions of each of said pair of adjustment liner plates so that a weld end portion is spaced from said extensions;

a pair of sealing sheets disposed on upper and lower sides of said adjustment liner plates and the member to be welded to be compressed by said upper and lower housings;

an electron gun disposed on said upper housing;

a drive device for moving said electron gun in a working direction; and a plurality of vacuum pumps for evacuating the vacuum chamber.

10. The apparatus according to claim 9, wherein said upper housing comprises a side wall portion, a first cover member, slidably and sealingly disposed on said side wall portion and having a central opening and a second cover member slidably and sealingly disposed on said first cover member so as to cover said central opening, said electron gun being mounted on said second cover member to emit electron beams in said vacuum housing.

11. The apparatus according to claim 9, wherein a pipe having a vacuum pump is provided to communicate an interior of said electron gun with said vacuum chamber whereby said vacuum pump evacuate the interior of said electron gun and exhaust an exhaust gas into said vacuum chamber.

12. The apparatus according to claim 10, wherein said drive device is mounted on said first cover member and connected to said second cover member to move said second cover member thereby to move said electron gun.

13. A process of effecting electron beam welding of a member to be welded in a vacuum chamber with a part of the member being in said vacuum chamber, said process comprises the steps of:
preparing upper and lower housings defining the vacuum chamber;
forming on the lower housing, first spaces for allowing the member to be welded to fit in and second spaces at both weld ends of a weld line of the member to be welded by arranging adjustment members;
fitting the member to be welded in the first spaces so that a welding line is disposed in the vacuum chamber and both sides of the welding line are spaced away from the lower housings;
sealing between the lower housing, adjustment member and the member to be welded;
putting the upper housing on the lower housing together with a sealing sheet, thereby forming the vacuum chamber;
evacuating the vacuum chamber; and
emitting electron beams on the welding line of the member to be welded in the vacuum chamber while moving the electron beam along the welding line.

14. An electroconductive member according to claim 1, wherein said electroconductive member is one of a poloidal field coil and a toroidal field coil for a nuclear fusion reactor system.

15. The apparatus according to claim 9 wherein each of said pair of adjustment liner plates extends beyond and edge of the lower housing.

16. The apparatus according to claim 1 wherein said detachable adjustment means is attached by a clamp.

17. The apparatus according to claim 4 wherein said one of said pair of projections mates another of said pair of projections.

18. The apparatus according to claim 4 wherein said sealing sheet covers a surface of the upper and lower housing.

19. The apparatus according to claim 9 wherein said plurality of vacuum pumps are successively arranged so that a first vacuum pump of the plurality of vacuum pumps exhausts into a second vacuum pump of the plurality of vacuum pumps.

20. The apparatus according to claim 1 wherein said member includes a pair of tabs located adjacent to said welding line portion, each of said spaces including a first space including said pair of tabs.

* * * * *